United States Patent
Lukin et al.

(10) Patent No.: US 11,996,285 B2
(45) Date of Patent: May 28, 2024

(54) SILICON-CARBIDE-ON-INSULATOR VIA PHOTOELECTROCHEMICAL ETCHING

(71) Applicant: The Board of Trustees of the Leland Stanford Junior University, Stanford, CA (US)

(72) Inventors: Daniil M. Lukin, East Setauket, NY (US); Jelena Vuckovic, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 447 days.

(21) Appl. No.: 17/466,768

(22) Filed: Sep. 3, 2021

(65) Prior Publication Data

US 2021/0398804 A1 Dec. 23, 2021

Related U.S. Application Data

(63) Continuation-in-part of application No. 16/805,073, filed on Feb. 28, 2020, now abandoned.

(60) Provisional application No. 63/074,145, filed on Sep. 3, 2020, provisional application No. 62/811,939, filed on Feb. 28, 2019.

(51) Int. Cl.
*H01L 21/02* (2006.01)
*H01L 21/321* (2006.01)

(52) U.S. Cl.
CPC .. *H01L 21/02167* (2013.01); *H01L 21/02172* (2013.01); *H01L 21/3212* (2013.01)

(58) Field of Classification Search
CPC ......... H01L 21/02167; H01L 21/02172; H01L 21/3212; H01L 21/76251; B82Y 20/00; G02B 2006/121
See application file for complete search history.

(56) References Cited

U.S. PATENT DOCUMENTS

| | | | |
|---|---|---|---|
| 6,699,770 B2 * | 3/2004 | Torvik | H01L 21/76256 438/455 |
| 7,109,092 B2 * | 9/2006 | Tong | H01L 24/92 257/E21.241 |
| 7,256,101 B2 | 8/2007 | Letertre | |

OTHER PUBLICATIONS

Lukin et al., "4H-silicon-carbide-on-insulator for integrated quantum and nonlinear photonics", Dec. 2019, Nature photonics.
Bracher et al., "Fabrication of High!Q Nanobeam Photonic Crystals in Epitaxially Grown 4H—SiC", 2015, Nano Letters v15, pp. 6202-6207.

* cited by examiner

*Primary Examiner* — Dale E Page
*Assistant Examiner* — Quovaunda Jefferson
(74) *Attorney, Agent, or Firm* — LUMEN PATENT FIRM

(57) ABSTRACT

Silicon carbide on insulator is provided by bonding bulk silicon carbide to a substrate with an oxide-oxide fusion bond, followed by thinning the bulk silicon carbide as needed. A doping-selective etch for silicon carbide is used to improve thickness uniformity of the silicon carbide layer(s).

13 Claims, 7 Drawing Sheets

SILICON-CARBIDE-ON-INSULATOR VIA PHOTOELECTROCHEMICAL ETCHING

CROSS REFERENCE TO RELATED APPLICATIONS

This application is a continuation in part of U.S. patent application Ser. No. 16/805,073 filed Feb. 28, 2020, which is incorporated herein by reference.

This application claims priority from U.S. Provisional Patent Application 63/074,145 filed Sep. 3, 2020, which is incorporated herein by reference.

Application Ser. No. 16/805,073 claims priority from U.S. Provisional Patent Application 62/811,939 filed Feb. 28, 2019, which is incorporated herein by reference.

GOVERNMENT SPONSORSHIP

This invention was made with Government support under contract DE-5C0019174 awarded by the Department of Energy. The Government has certain rights in the invention.

FIELD OF THE INVENTION

This invention relates to fabrication of silicon carbide on insulator structures.

BACKGROUND

It is often desired to provide optoelectronically active materials in an thin-film on insulator configuration. However, providing such configurations is technologically non-trivial and highly material-dependent. For example, silicon wafers have been widely available since the 1970s, but silicon-on-insulator technology was not commercialized until the 2000s. That success with silicon has not solved the problem of providing other optoelectronically active materials in this configuration.

Silicon carbide (SiC) is one such optoelectronically active material. Here the situation is more complicated than with silicon because silicon carbide has more than 250 different polymorphs. The most commonly used SiC polymorphs are 3C—, 4H— and 6H—SiC. While e.g. 3C—SiC can be grown heteroepitaxially on Si, 4H—SiC can only be grown homoepitaxially on 4H—SiC (the same is true for many other polymorphs). Even heteroepitaxially grown 3C—SiC films on Si do not have the same pristine crystal quality as when grown homoepitaxially on 3C—SiC.

Work to date on providing SiC on insulator has considered two approaches. In the first, a thin layer of SiC is heteroepitaxially grown on a different substrate and then the SiC layer is transferred to an oxide-on-silicon substrate. In the second, bulk silicon carbide is used and an ion implant of the bulk silicon carbide is performed to define the thin layer of silicon carbide to be transferred to an oxide-on-silicon substrate. This second approach is often referred to as the smart-cut process.

However, both these approaches have substantial disadvantages. Heteroepitaxial growth of SiC can be difficult or even impossible depending on the desired polymorph, and even in cases where it is possible, the crystal quality is usually reduced. The ion implantation required by the smart cut process also reduces material quality. Accordingly, it would be an advance in the art to provide fabrication of SiC on insulator structures with improved SiC material quality.

SUMMARY

In this work, we provide SiC on insulator using bonding, thinning and polishing techniques. The Silicon-Carbide-on-Insulator (SiCOI) that we have developed can be implemented on wafer scale and can be readily used on an industrial scale for a range of applications including electronics and photonics.

Silicon carbide has many different applications ranging from electric systems, electronic circuit elements, power electronics, LEDs, astronomy, thin filament pyrometry, heating elements, microwave photonics, photonics, quantum physics, and quantum photonics.

For example, 4H—SiC hosts color centers (point defects), which can be used as single-photon sources and quantum bits in quantum information processing (quantum computation, quantum communication, quantum transduction, quantum repeaters, photonic quantum simulators and many more). For such applications, pristine crystal quality is a necessity, as high density of defects introduces noise and reduce the optical properties of our quantum emitters to a point that they are no longer optically active. Alternative techniques, such as smart cut, leads to such poor crystal quality that we no longer see emission from quantum emitters and optical background noise is overwhelming. It can be expected that better crystal quality will also result in better performance of electronics based on SiC.

To date it is impossible to grow thin films of 4H—SiC on a material different from 4H—SiC. Thus, SiCOI through wafer bonding, thinning and polishing is the only technique which allows one to produce thin films of 4H—SiC with high yield and pristine crystal quality. This technique will also work for other polymorphs and will also improve the crystal quality of 3C—SiC thin films compared to heteroepitaxially grown 3C—SiC on Si films and films produced using Smart-Cut.

In a preferred embodiment, the above-described process is improved by using a doping-selective etch of silicon carbide to improve thickness uniformity.

DETAILED DESCRIPTION

Figure 1A:
FIGS. 1A-D show an exemplary fabrication sequence relating to embodiments of the invention.
Figure 1B:
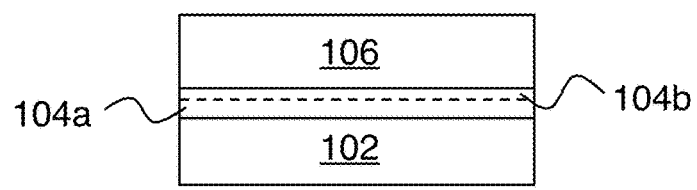

FIGS. 1A-D show an exemplary fabrication sequence. In this example, we begin with a 4-inch wafer of high purity semi-insulating 4H—SiC (106) and dice it into 10×10 mm chips. Chips are cleaned in IPA, Acetone, Piranha and HF, and undergo dry oxidation at 1000C for 90 minutes to grow several hundred angstroms of thermal $SiO_2$ (104b). Separately, a $SiO_2$-on-Si handle wafer is prepared by thermal oxidation to provide oxide 104a on silicon substrate 102. The chips are subsequently bonded to the handle wafer at room temperature with manual pressure. The bond is strengthened by annealing at 900C, which results in a robust $SiO_2$—$SiO_2$ fusion bond (FIG. 1B, fusion bond shown with a dashed line). Afterwards, the Si handle wafer with SiC chips on top is transferred to a wafer grinder (DAG810 from Disco Corp.) The chips are ground to a thickness of 15 μm.

Figure 1C:
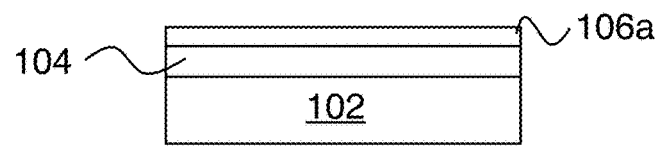
Figure 1D:
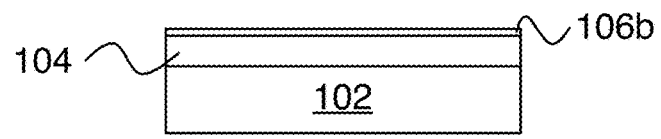

During the final grinding stage, a final roughness of 7 nm RMS is achieved. The wafer is then chemically-mechanically polished (POLI-400L from G&P Tech.) to a final roughness of <3 Angstrom RMS (FIG. 1C). Finally, the SiC film is further thinned down to the desired thickness via reactive ion etching (RIE) in $SF_6$ $O_2$ plasma (PlasmaTherm Versaline ICP) (FIG. 1D).

Although this example is chip-scale, not wafer scale, the same principles are applicable at wafer scale. For this purpose, we might want to switch from Si handle wafers 102 to SiC wafers 102 as on wafer scale thermal stress during and after the bonding procedure might cause a whole SiC wafer bonded to $SiO_2$ on Si to detach due to thermal stress. Then the process would change as follows, still with reference to FIGS. 1A-D: Substrate 102 is SiC, and because thermal oxidation of SiC is limited to about 50 nm, if a thicker oxide layer 104 is needed, then additional oxide can be deposited on the thermal oxide (e.g., with chemical vapor deposition). This deposition of extra oxide can be part of forming oxide layers 104a and/or 104b. The remaining process steps are as described above.

Capping of SiC devices with $SiO_2$ via TEOS, LPCVD or similar, typically improves performance and is done by us for devices such as waveguides or ring resonators. Furthermore, implementing a $Si_xN_y$ platform as shown in FIGS. 2A-H, we can post select certain devices and connect them using $Si_xN_y$ photonics.

Figure 2A:
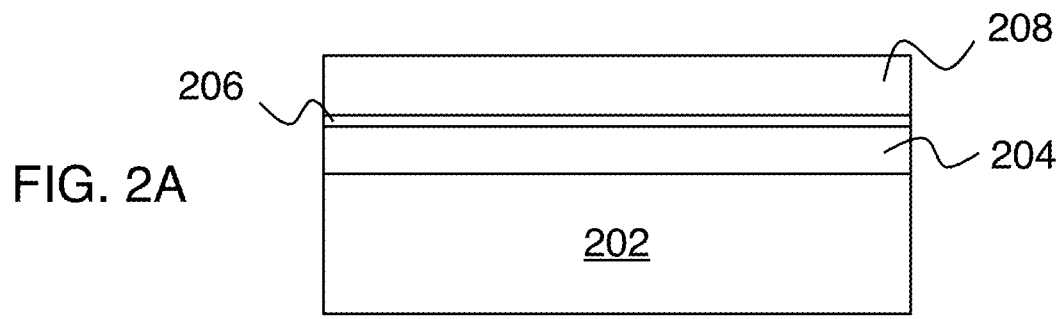
FIGS. 2A-H show an example of how a photonic circuit having SiC active devices connected by silicon nitride waveguides can be fabricated.
Figure 2B:
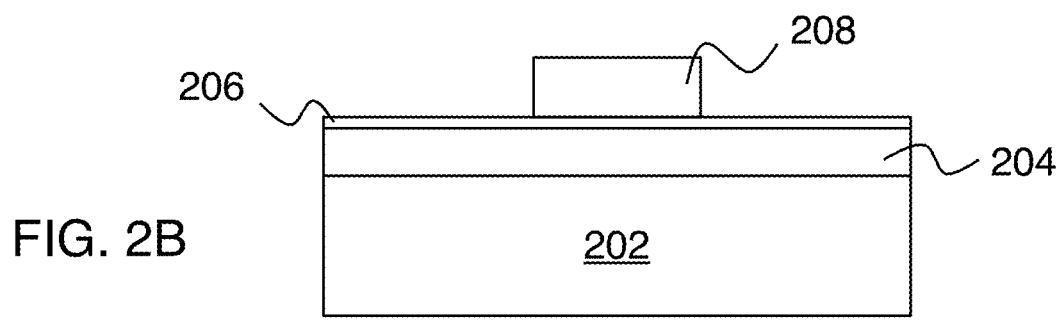
Figure 2C:
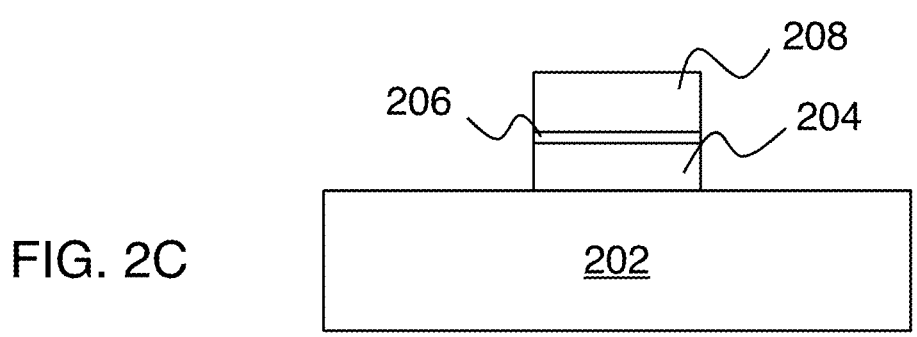
Figure 2D:
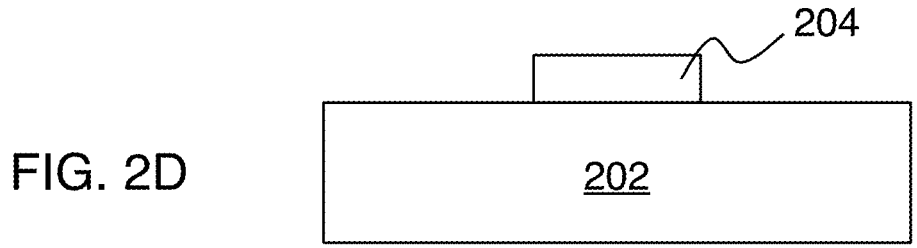
Figure 2E:
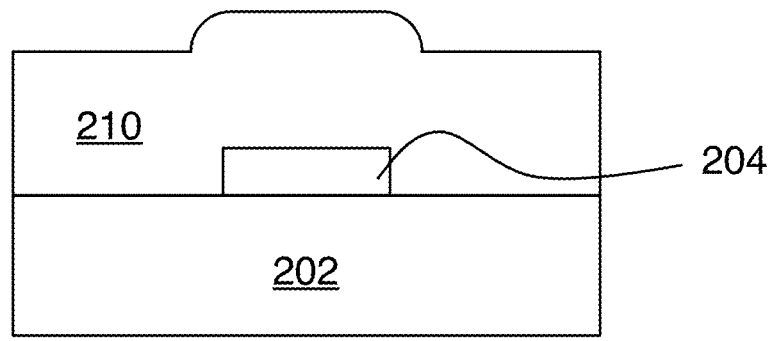
Figure 2F:
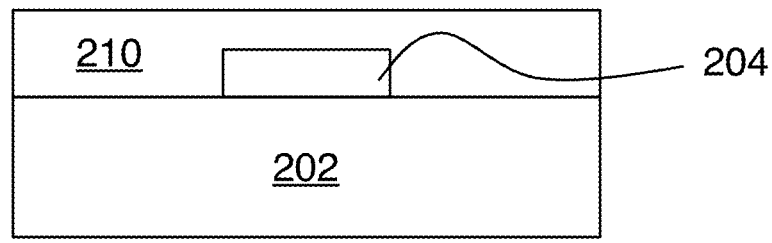
Figure 2G:
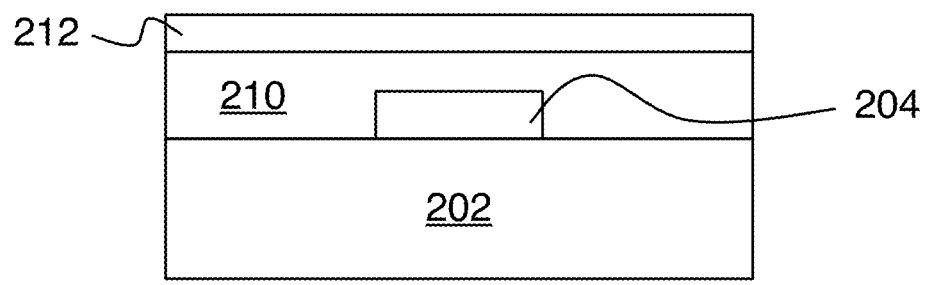
Figure 2H:
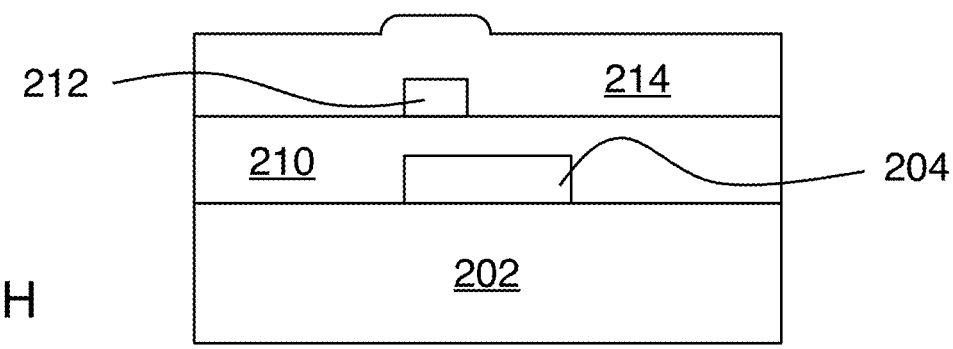

The starting point of FIG. 2A shows SiC 204 disposed on oxide 202 (the substrate beneath the oxide is not shown in this sequence of figures). Here 206 is a thin (e.g., 50 nm) layer of photoresist (e.g., PMMA (Polymethyl methacrylate)), and 208 is an HSQ (Hydrogen silsesquioxane) layer. FIG. 2B shows the result of e-beam patterning layer 208. FIG. 2C shows the result of etching (e.g., with reactive ion etching) this pattern into the SiC layer 204. FIG. 2D shows the result of lifting off the HSQ layer 208. FIG. 2E shows the result of depositing oxide 210 (optionally preceded by an oxidization of the exposed surfaces of SiC 204). FIG. 2F shows the result of planarizing oxide 210. FIG. 2G shows the result of depositing silicon nitride layer 212. FIG. 2H shows the result of patterning nitride 212 and encapsulating the resulting pattern with silicon oxide 214. The resulting structure can use nitride waveguides to vertically couple to SiC active devices, thereby forming photonic circuits.

EXAMPLE

FIGS. 3A-E show exemplary fabrication and experimental results according to the above described principles.

Figure 3A:
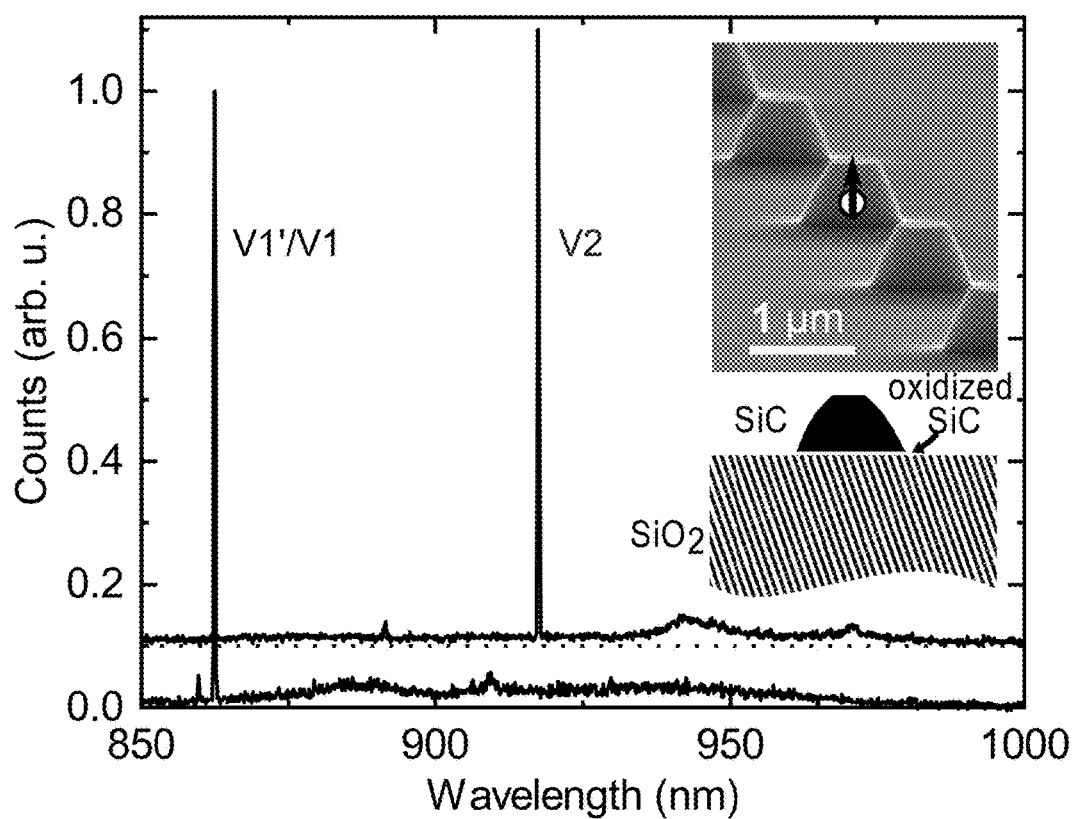
FIGS. 3A-E show fabrication and characterization results relating to exemplary embodiments of the invention.

FIG. 3A shows photoluminescence spectra of color centers in pillars fabricated in 4H—SiCOI; h-Vsi (V1'/V1) and k-$V_{Si}$ (V2). These results show narrow linewidths and low-intensity phonon sidebands. The insets of FIG. 3A are an SEM image of micropillars (top) and the corresponding material stack (bottom).

Figure 3B:
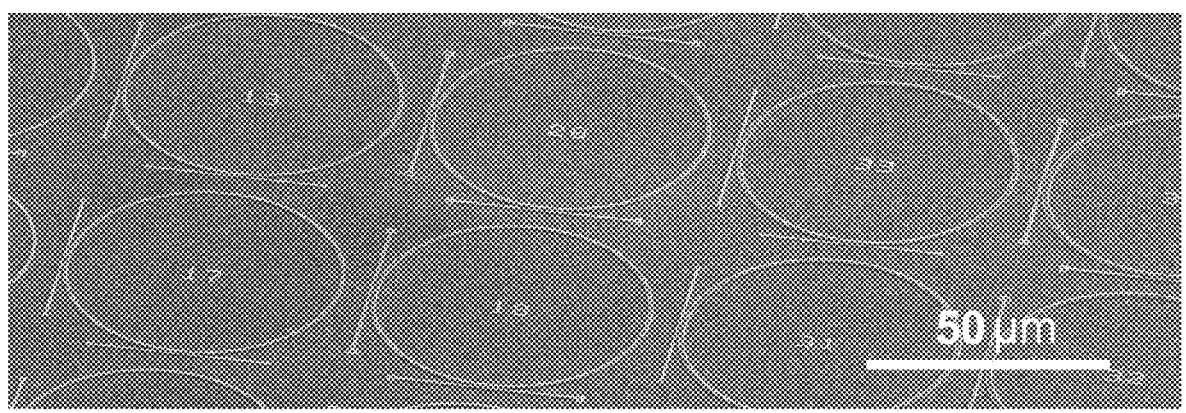

FIG. 3B is an SEM image of an array of 4H—SiCOI ring resonators before SiO2 encapsulation.

Figure 3C:
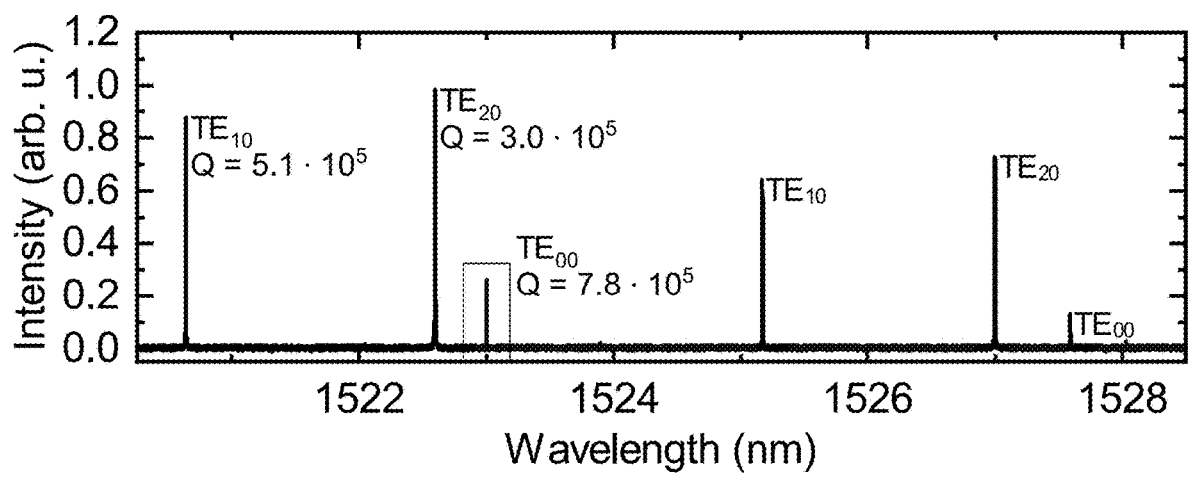

FIG. 3C shows a drop-port spectrum of a ring with diameter of 55 μm, in which three TE mode families can be seen.

Figure 3D:
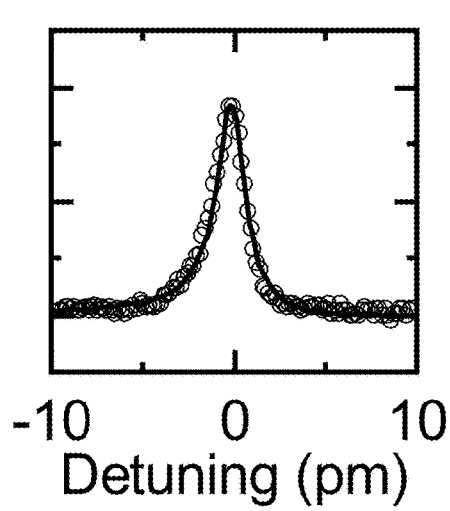

FIG. 3D shows a fundamental mode resonance with Q of $7.8 \times 10^5$ (highlighted in FIG. 3C).

Figure 3E:
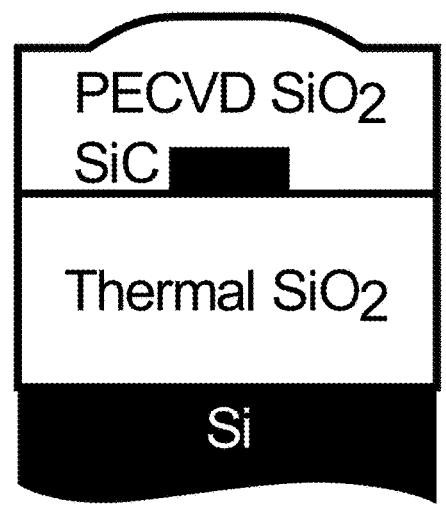

FIG. 3E shows a cross-section of a completed device (dimensions not to scale).

In this section, we demonstrate a low-loss 4H-silicon-carbide-on-insulator (4H—SiCOI) photonics platform using the above-described wafer bonding and thinning technique. In contrast with previous approaches, this fabrication process does not compromise the crystalline integrity of the device layer. This enabled us to show an improvement in quality factor Q by an order of magnitude over previous approaches in 4H—SiC.

Using spatially resolved photoluminescence spectroscopy, we observed single color centers in 4H—SiCOI (FIG. 3A), which had not been possible before in thin-film SiC due to compromised crystal quality. Color center characterization was performed after fabricating micropillars via reactive ion etching to improve the photon collection efficiency. The inset of FIG. 3A shows a scanning electron microscopy (SEM) image of a micropillar, while the main panel shows typical spectra of single V1 (h-lattice site) and V2 (k-lattice site) silicon vacancies ($V_{Si}$).

Measurements were performed at a temperature of 5K in a closed-cycle cryostat (Montana Instruments), with above-resonant excitation at 740 nm. The color center spectra show weak emission into the phonon sideband and minimal background noise, as reported in bulk 4H—SiC. By recording the fraction of micropillars that contain an emitter and estimating the micropillar volume, we arrive at an optically active defect density of 0.1 Vsi per μm$^3$. In initial experiments we observed that 4H-SiC is susceptible to strong background noise at the SiC—$SiO_2$ fusion bond, as well as at interfaces between SiC and the plasma-enhanced chemical vapor-deposited (PECVD) oxide cladding layer. This noise overwhelmed the emission from color centers and would probably render the platform unusable for quantum applications. However, we found that a 20 nm thermal oxide layer grown on SiC before bonding or PECVD deposition fully eliminated this undesirable photoluminescence, acting as a buffer against optically active formations at the SiC interface. We thus achieved the same low background noise observed in high-purity homoepitaxial bulk crystal.

To demonstrate that our 4H—SiCOI approach also enables low-loss SiC photonics, we fabricated microring resonators (FIGS. 3B-D). We characterized their optical properties in a two-waveguide drop-port configuration using a fiber-interferometer-calibrated frequency scan, as shown in FIG. 3B. Three transverse electric (TE) mode families were observed in rings with diameter of 55 μm, width of 2.5 μm and height of 350 nm. A maximum Q factor of $7.8 \times 10^5$ was measured for the fundamental mode, corresponding to a propagation loss of 0.5 dB $cm^{-1}$ (calculated using the simulated effective refractive index of the mode). This is an order of magnitude improvement over the current state of the art in 4H—SiC waveguides, where material absorption is cited as the limiting factor.

Doping Selective Etch

One significant limitation of the above-described approach to fabricating SiCOI is that it results in thin films of SiC with some thickness variation. Although such thickness variation is acceptable for most research applications, it is not optimal for industrial scalability of the approach. Overcoming this limitation would significantly boost the commercial appeal of high quality SiCOI fabrication technology.

It has been demonstrated that using heavily doped homoepitaxial layers of 4H—SiC, doping-selective etching of SiC can be achieved via photoelectrochemical etching [D. O. Bracher and E. L. Hu, "Fabrication of high-Q nanobeam photonic crystals in epitaxially grown 4H—SiC", Nano Letters, 2015, hereby incorporated by reference in its entirety]. We use this etching approach to produce thin films of high quality 4H—SiC films with wafer-scale uniformity on insulator. Doping-selective photoelectrochemical etching of SiC in combination with bulk grinding as described above can produce thin films of high quality 4H—SiC films on insulator with wafer-scale uniformity.

Figure 4A:
FIGS. 4A-D show another exemplary fabrication sequence relating to embodiments of the invention.

FIGS. 4A-D shows a first exemplary process. FIG. 4A shows the results of forming a first oxide layer 104 on a surface of first substrate 102 to provide a first structure (FIG. 4A, left) and forming a silicon carbide layer stack 406a, 406b, on a second substrate 106 to provide a second structure (FIG. 4A, right).

In one example, layers 406a and 406b are a commercially grown epilayer stack of a sacrificial heavily (e.g., $1e^{18}$ cm$^{-3}$ or more) p-doped SiC layer (406a) on a SiC carrier wafer 106 (typically n-doped but can be i- or p-doped). Then, the device layer (406b) is grown, typically i-doped but can be any doping or a combination of several doping layers, as long as the doping, if p, is lower than the sacrificial doping (e.g., preferably $1e^{17}$ cm$^{-3}$ or less). For p-doped device layers, etch-stop selectivity will degrade, to an extent dependent on the specific etch parameters used. Note that depending on the photoelectrochemical etching conditions, it is possible to replace the p-doped sacrificial layer with an n-doped sacrificial layer and to achieve the same selective etching.

Figure 4B:
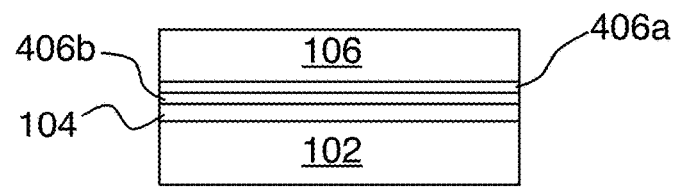

FIG. 4B shows the result of fusion bonding the first structure to the second structure to provide a bonded structure, where the first substrate 102 and the second substrate 106 sandwich the silicon carbide layer stack 406a, 406b, and the first oxide layer 104.

Figure 4C:
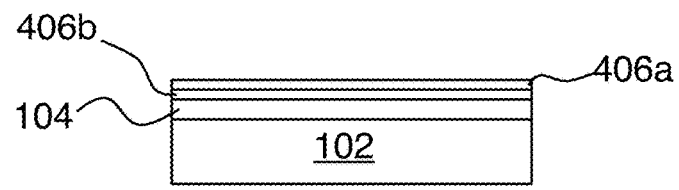

FIG. 4C shows the result of removing the second substrate 106 from the bonded structure with a material removal process to expose at least a bottom layer 406a of the silicon carbide layer stack.

Figure 4D:
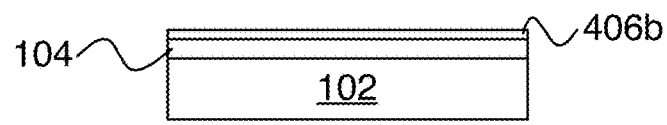

FIG. 4D shows the result of performing a doping selective etch that selectively removes at least the bottom layer 406a of the silicon carbide layer stack and stops on a selected layer (406b in this example) of the silicon carbide layer stack according to doping differences in the silicon carbide layer stack.

The overall result of this process is layer 406b of SiC on insulator 104 that has improved thickness uniformity, while also providing the above-described advantages of improves material quality.

Thus, instead of relying on the grinding process to produce the desired thickness of the device layer 406b, the grinding is terminated once all of the original SiC substrate 106 is removed, but the intrinsic device layer 406b has not yet been affected. Thus, the grinding nonuniformity is confined entirely to the heavily p-doped layer 406a. Then, using a doping-selective etch, the p-doped layer 406a is chemically etched. In one example, this process etches the p-doped layer 406a quickly (350-400 nm/min), and the device layer 406b slowly (<10 nm/min), but does produce residual roughness in the 1-5 nm RMS range. Using chemical mechanical polishing, this roughness can be eliminated, and the resulting structure is SiC on insulator with negligible nonuniformity across an entire wafer. The main advantage of this approach is greater thickness uniformity of the resulting SiC on insulator layer.

Preferably no ion implantation of the silicon carbide layer stack is performed prior to the fusion bonding, as in the previously described examples.

The material removal process (i.e., the removal of second substrate 106) can include grinding and polishing.

The first substrate can be silicon or silicon carbide.

The silicon carbide layer stack can include one or more optically active color centers. In such cases, the area density of the optically active color centers is preferably at least 0.05/$\mu m^2$. The presence of optically active color centers in high concentration is an important sign of good material quality. Poor quality material, such as heteroepitaxially grown 4H SiC, does not have optically color centers with concentration of 0.05/$\mu m^2$ or more.

Forming the first oxide layer 104 on the surface of the first substrate 102 can be done by oxidizing a surface of the first substrate, or by depositing an oxide on the first substrate.

The silicon carbide on insulator structure can include a 4H silicon carbide polymorph.

In the example of FIGS. 4A-D, the fusion bonding of FIG. 4B is bonding a top surface of the first oxide 104 to a top surface of the silicon carbide layer stack. It is also possible to perform this process with an oxide-oxide fusion bond, as in the example of FIGS. 1A-D.

Figure 5A:
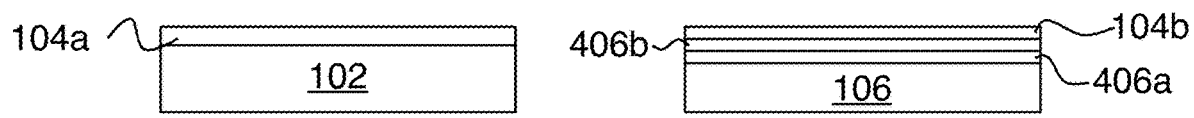
FIGS. 5A-D show a further exemplary fabrication sequence relating to embodiments of the invention.
Figure 5B:
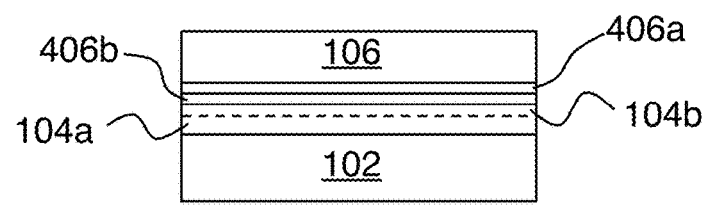
Figure 5C:
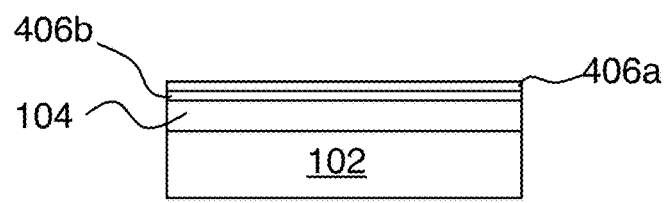
Figure 5D:
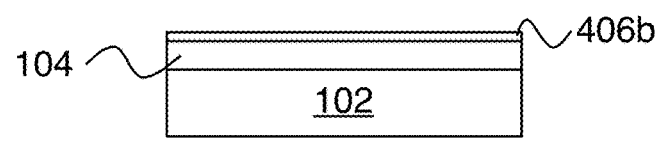

FIGS. 5A-D show this variation, and are the same as FIGS. 4A-D except as follows. FIG. 5A shows the results of forming a first oxide layer 104a on a surface of first substrate 102 to provide a first structure (FIG. 5A, left) and forming a second oxide layer 104b on a top surface of silicon carbide layer stack 406a, 406b (FIG. 5A, right), prior to the fusion bonding. In the fusion bonding of FIG. 5B, the fusion bonding bonds a top surface of the second oxide layer 104b to a top surface of the first oxide layer 104a to form a single oxide layer 104.

Forming the second oxide layer 104b on the top surface of the silicon carbide layer stack can be done by: 1) oxidizing a top surface of the silicon carbide layer stack; 2) depositing an oxide on the silicon carbide layer stack; or 3) oxidizing a top surface of the silicon carbide layer stack followed by depositing an oxide on the silicon carbide layer stack.

The invention claimed is:

1. A method of making a silicon carbide on insulator structure, the method comprising:
   forming a first oxide layer on a surface of a first substrate to provide a first structure;
   forming a silicon carbide layer stack on a second substrate to provide a second structure;
   fusion bonding the first structure to the second structure to provide a bonded structure, wherein the first substrate and the second substrate sandwich the silicon carbide layer stack and the oxide layer;
   removing the second substrate from the bonded structure with a material removal process to expose at least a bottom layer of the silicon carbide layer stack; and
   performing a doping selective etch that selectively removes at least the bottom layer of the silicon carbide layer stack and stops on a selected layer of the silicon carbide layer stack according to doping differences in the silicon carbide layer stack.

2. The method of claim 1, further comprising chemical-mechanical polishing of an exposed surface of the silicon carbide layer stack after performing the doping selective etch in order to reduce surface roughness of the silicon carbide layer stack.

3. The method of claim 1, wherein no ion implantation of the silicon carbide layer stack is performed prior to the fusion bonding.

4. The method of claim 1, wherein the material removal process includes grinding and polishing.

5. The method of claim 1, wherein the first substrate comprises silicon.

6. The method of claim 1, wherein the first substrate comprises silicon carbide.

7. The method of claim 1, wherein the silicon carbide layer stack comprises one or more optically active color centers.

8. The method of claim 7, wherein an area density of the one or more optically active color centers is at least $0.05/\mu m^2$.

9. The method of claim 1, wherein the forming a first oxide layer on the surface of the first substrate comprises a method selected from the group consisting of: oxidizing a surface of the first substrate and depositing an oxide on the first substrate.

10. The method of claim 1, wherein the silicon carbide on insulator structure includes a 4H silicon carbide polymorph.

11. The method of claim 1, wherein the fusion bonding bonds a top surface of the silicon carbide layer stack to a top surface of the first oxide layer.

12. The method of claim 1, further comprising forming a second oxide layer on a top surface of the silicon carbide layer stack prior to the fusion bonding, wherein the fusion bonding bonds a top surface of the second oxide layer to a top surface of the first oxide layer.

13. The method of claim 12, wherein the forming a second oxide layer on the top surface of the silicon carbide layer stack comprises a method selected from the group consisting of: oxidizing a top surface of the silicon carbide layer stack; depositing an oxide on the silicon carbide layer stack; and oxidizing a top surface of the silicon carbide layer stack followed by depositing an oxide on the silicon carbide layer stack.

* * * * *